United States Patent
Disney

(10) Patent No.: US 8,264,858 B2
(45) Date of Patent: Sep. 11, 2012

(54) ELECTRONIC CIRCUIT CONTROL ELEMENT WITH TAP ELEMENT

(75) Inventor: Donald R. Disney, Cupertino, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 13/399,755

(22) Filed: Feb. 17, 2012

(65) Prior Publication Data

US 2012/0146141 A1 Jun. 14, 2012

Related U.S. Application Data

(63) Continuation of application No. 12/626,466, filed on Nov. 25, 2009, now Pat. No. 8,144,484, which is a continuation of application No. 11/968,599, filed on Jan. 2, 2008, now Pat. No. 7,636,247, which is a continuation of application No. 11/495,382, filed on Jul. 28, 2006, now Pat. No. 7,333,351, which is a continuation of application No. 11/045,428, filed on Jan. 27, 2005, now Pat. No. 7,102,900, which is a continuation of application No. 10/446,312, filed on May 27, 2003, now Pat. No. 6,865,093.

(51) Int. Cl.
*H02M 3/335* (2006.01)
(52) U.S. Cl. ............ 363/21.1; 363/21.04; 363/21.12; 363/18; 363/19; 363/20
(58) Field of Classification Search ............ 363/21.1, 363/21.04, 21.12, 18, 19, 20
See application file for complete search history.

(56) References Cited

U.S. PATENT DOCUMENTS

| | | | |
|---|---|---|---|
| 4,263,463 A | 4/1981 | Kitamura et al. | |
| 4,263,643 A | 4/1981 | Koike | |
| 4,754,310 A | 6/1988 | Coe | |
| 4,811,075 A | 3/1989 | Eklund | |
| 5,014,178 A | 5/1991 | Balakrishnan | |
| 5,063,313 A | 11/1991 | Kikuda et al. | |
| 5,146,298 A | 9/1992 | Eklund | |

(Continued)

FOREIGN PATENT DOCUMENTS

EP 0 585 789 A1 3/1994

(Continued)

OTHER PUBLICATIONS

EP 04 25 2903—Partial European Search Report, dated Aug. 20, 2004 (5 pages).

(Continued)

*Primary Examiner* — Bao Q Vu
(74) *Attorney, Agent, or Firm* — Blakely Sokoloff Taylor & Zafman LLP

(57) ABSTRACT

A technique for controlling a power supply with power supply control element with a tap element. An example power supply control element includes a power transistor that has first and second main terminals, a control terminal and a tap terminal. A control circuit is coupled to the control terminal. The tap terminal and the second main terminal of the power transistor are to control switching of the power transistor. The tap terminal is coupled to provide a signal to the control circuit substantially proportional to a voltage between the first and second main terminals when the voltage is less than a pinch off voltage. The tap terminal is coupled to provide a substantially constant voltage that is less than the voltage between the first and second main terminals to the control circuit when the voltage between the first and second main terminals is greater than the pinch-off voltage.

13 Claims, 5 Drawing Sheets

U.S. PATENT DOCUMENTS

| | | | |
|---|---|---|---|
| 5,216,275 | A | 6/1993 | Chen |
| 5,282,107 | A | 1/1994 | Balakrishnan |
| 5,285,369 | A | 2/1994 | Balakrishnan |
| 5,313,082 | A | 5/1994 | Eklund |
| 5,386,136 | A | 1/1995 | Williams et al. |
| 5,438,215 | A | 8/1995 | Tihanyi |
| 5,517,152 | A | 5/1996 | Miki et al. |
| 5,521,105 | A | 5/1996 | Hsu et al. |
| 5,637,898 | A | 6/1997 | Baliga |
| 5,734,564 | A | 3/1998 | Brkovic |
| 5,973,360 | A | 10/1999 | Tihanyi |
| 5,998,833 | A | 12/1999 | Baliga |
| 6,184,555 | B1 | 2/2001 | Tihanyi et al. |
| 6,207,994 | B1 | 3/2001 | Rumennik et al. |
| 6,259,618 | B1 | 7/2001 | Liaw et al. |
| 6,388,286 | B1 | 5/2002 | Baliga |
| 6,414,855 | B1 | 7/2002 | Yasuda |
| 6,462,971 | B1 | 10/2002 | Balakrishnan et al. |
| 6,504,733 | B1 | 1/2003 | Watson, III et al. |
| 6,525,372 | B2 | 2/2003 | Baliga |
| 7,002,398 | B2 | 2/2006 | Disney |
| 7,696,566 | B2 | 4/2010 | Disney |
| 7,872,304 | B2 | 1/2011 | Disney |
| 2002/0060340 | A1 | 5/2002 | Deboy et al. |
| 2002/0060913 | A1 | 5/2002 | Yasuda |
| 2002/0159276 | A1 | 10/2002 | Deboy et al. |
| 2002/0175351 | A1 | 11/2002 | Baliga |
| 2003/0001548 | A1 | 1/2003 | Feldtkeller |
| 2004/0240233 | A1 | 12/2004 | Disney |

FOREIGN PATENT DOCUMENTS

| | | |
|---|---|---|
| EP | 1 291 907 A2 | 3/2003 |
| EP | 1 486 844 A2 | 12/2004 |
| EP | 1 615 324 A2 | 1/2006 |
| JP | 06-165485 | 6/1994 |
| JP | 06-169567 | 6/1994 |
| JP | 07-087733 | 3/1995 |
| JP | 2002-517116 | 6/2002 |
| WO | WO 99/62174 A1 | 12/1999 |
| WO | WO 03/050882 A1 | 6/2003 |

OTHER PUBLICATIONS

EP 04 25 2903—European Search Report, dated Jan. 4, 2005 (4 pages).

EP 07 02 4069—Partial European Search Report mailed Sep. 25, 2008 (Publication No. EP 1 903 417) (6 pages).

EP 07 02 4069—European Search Report mailed Dec. 23, 2008 (Publication No. EP 1 903 417) (6 pages).

Clemente, S., "Gate Drive Characteristics and Requirements for Power HEXFET® s," Application Note 937B, HEXFET Designer's Manual, vol. 1: Power MOSFETs Application and Reliability Data, International Rectifier, 1993, pp. 7-14.

Millman, J. et al., "Microelectronics," Second Edition, Chapter 4: Field-Effect Transistors, McGraw-Hill, Singapore, 1987, pp. 133-170.

"Off-Line SMPS Current Mode Controller with Integrated 500V Startup Cell," Infineon Technologies AG, Datasheet, V1.0, Version 1.0, (May 2003), (2 pages), http://www.infineon.com.

Fujihira, T., "Theory of Semiconductor Superjunction Devices," Matsumoto Factory, Fuji Electric Co., Ltd., 4-18-1 Tsukama, Matsumoto 390, Japan; Graduate School of Engineering, Yamanashi University, 4-3-11 Takeda, Koufu 400, Japan, Jul. 23, 1997, pp. 6251-6259.

Fujihira, T., et al., "Simulated Superior Performances of Semiconductor Superjunction Devices," Matsumoto Factory, Fuji Electrical Co., Ltd., 4-18-01 Tsukama, Matsumoto 390-0821, Japan; Graduate School of Engineering, Yamanashi University, until Mar. 31, 1998, 423-426.

"Off Line Primary Switch," ST Microelectronics, VIPer53DIP, VIPer53SP, Dec. 2003, pp. 1-24.

"CoolSET™-F3," Infineon Technologies AG, Preliminary Datasheet, V1.2, May 21, 2004, pp. 1-28, http://www.infineon.com.

Alberkrack, J., et al., "Monolithic Offline Switcher," PCIM, (May 1999), pp. 55-59.

"SMP 220, PWM Power Supply IC, 85-265 VAC Input Isolated, Regulated DC Output" Power Integrations, Inc., (Jan. 1996), pp. 2-73-2-80.

"CoolSET™-F2, Off-line SMPS Current Mode Controller with integrated 650V/800V CoolMOS™" Infineon Technologies AG, Datasheet, V4.4, (Dec. 2003), pp. 3-33, http://www.infineon.com.

"FSDM0565R Green Mode Fairchild Power Switch (FPS)," Rev. 1.0.1, Fairchild Semiconductor Corporation, (Feb. 9, 2004), pp. 1-20, www.fairchildsemi.com.

EP 05 25 4248—European Search Report and Written Opinion, dated Feb. 24, 2010 (6 pages).

EP 10 17 6318—European Search Report, dated Oct. 13, 2010 (3 pages).

EP 04 25 2903—Summons to Attend Oral Proceedings, dated Feb. 6, 2008 (5 pages).

JP 2005-199707—Notice of the Reason for Refusal, mailed Oct. 30, 2007 (3 pages).

EP 07 024 069—European Office Action, dated Sep. 14, 2011 (5 pages).

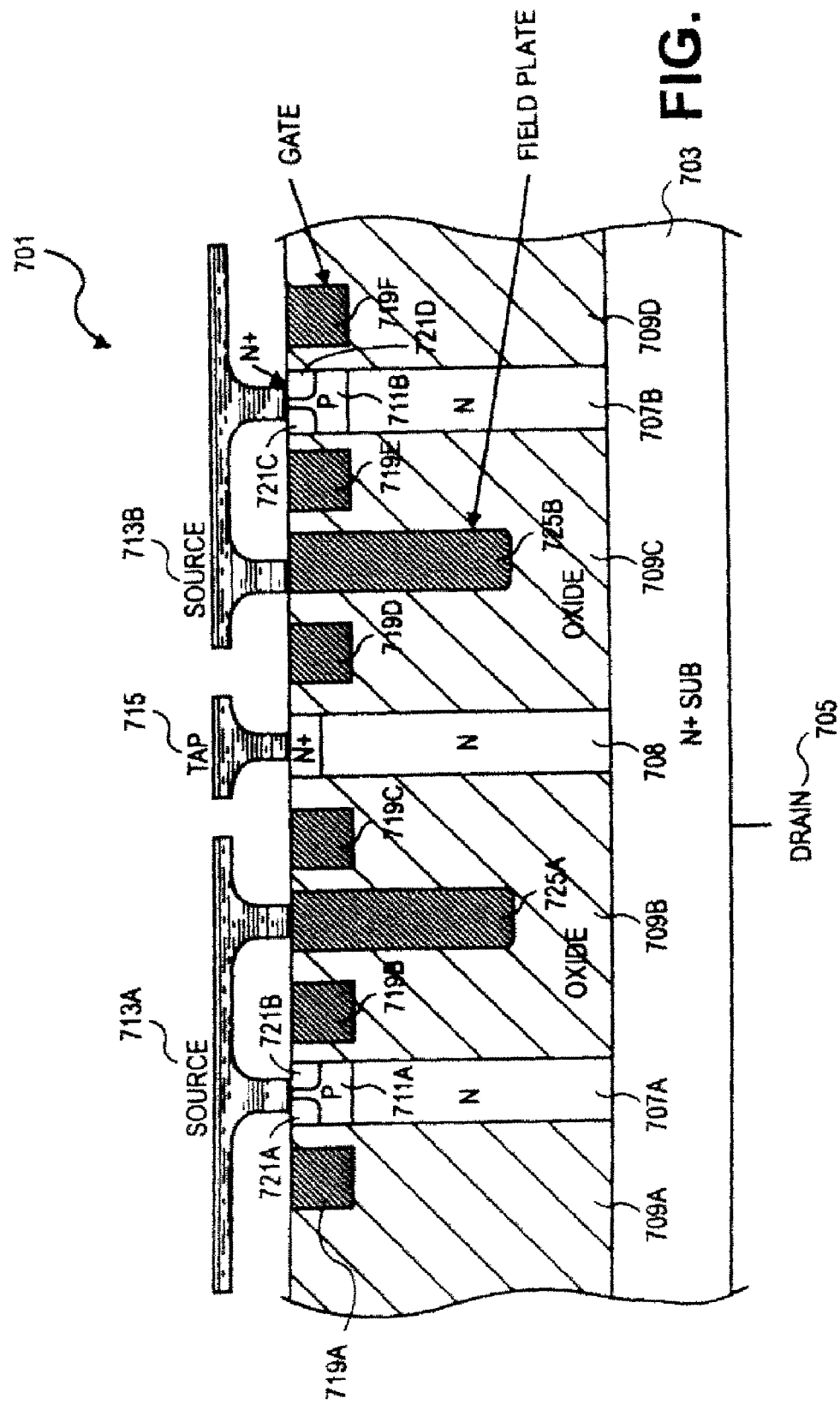

ELECTRONIC CIRCUIT CONTROL ELEMENT WITH TAP ELEMENT

REFERENCE TO PRIOR APPLICATIONS

This application is a continuation of U.S. application Ser. No. 12/626,466, filed Nov. 25, 2009, now pending, which claims priority to U.S. application Ser. No. 11/968,599, filed Jan. 2, 2008, now U.S. Pat. No. 7,636,247, which claims priority to U.S. application Ser. No. 11/495,382, filed Jul. 28, 2006, now U.S. Pat. No. 7,333,351, which claims priority to U.S. application Ser. No. 11/045,428, filed Jan. 27, 2005, now U.S. Pat. No. 7,102,900, which claims priority to U.S. application Ser. No. 10/446,312, filed May 27, 2003, now U.S. Pat. No. 6,865,093 entitled "Electronic Circuit Control Element With Tap Element." U.S. application Ser. Nos. 12/626,466, 11/968,599, 11/495,382, 11/045,428, and 10/446,312 are hereby incorporated by reference.

BACKGROUND OF THE INVENTION

1. Field of the Invention

The present invention relates generally to control elements used in electronic circuits and, more specifically, the present invention relates to control elements with integrated power transistors.

2. Background Information

Two of the primary goals in the design of control elements with integrated power transistors are cost and performance. Cost is generally reduced when the number of external components required in the electronic circuit are reduced, and when smaller, more efficient power transistors are employed. Performance may be improved by adopting a more efficient power transistor, which increases efficiency, and by lowering the manufacturing variance, which allows better control of critical parameters such as the peak current delivered by the power transistor.

FIG. 1 shows a power supply 10, which is provided as an example of an electronic circuit using a control element with power transistor. The control element 22 for this known power supply 10 includes a control circuit 23 and a separate power transistor 21. In power supply 10, the start-up function is performed by resistor 32, which provides the high voltage DC from bridge rectifier 12 to the control circuit 23. Unfortunately, resistor 32 is expensive, requires a large area in the power supply and lowers supply efficiency by dissipating power continuously, even after the start-up function is completed. The current limit function of power supply 10 is provided by a sense resistor 33 that is in series with the source of power transistor 21. The voltage across resistor 33, which increases with increasing current through power transistor 21, is coupled to the control circuit 23. When the current through power transistor 21 reaches a predetermined level, the control circuit 23 turns of power transistor 21. Drawbacks of this approach are the cost, size and power dissipation of resistor 33.

FIG. 2 shows a known power supply 50 similar to power supply 10, except that resistor 32 has been eliminated. A voltage regulator internal to power supply chip 52 now performs the start-up function. The voltage regulator in power supply chip 52 may be turned off after the start-up function is completed, thus eliminating the extra power dissipation inherent to power supply 10. However, the voltage regulator in power supply chip 52 includes a high-voltage offline transistor 54 that consumes a significant area on power supply chip 52 and is also prone to electrical static discharge (ESD) and safe operating area (SOA) damage.

FIG. 3 shows a known power supply 70 that avoids some of the problems of power supplies 10 and 50. Power supply 70 does not require a start-up resistor 32 or a high-voltage offline transistor 54. Instead, a tap 90 at the junction between junction field effect transistor (JFET) 86 and insulated gate field effect transistor (IGFET) 88 of metal oxide semiconductor field effect transistor (MOSFET) 84 is used to perform the start-up function. Tap 90 may also be used to monitor the voltage for performing the current limit function, obviating the need for a separate sense resistor. The main limitation of this approach is that the MOSFET 84 used in power supply 70 is limited to one that can be monolithically integrated on the chip 82. In some cases, discrete power devices with higher efficiency may be available, but cannot be employed in the monolithic approach of power supply 70.

SUMMARY OF THE INVENTION

An integrated control element with power transistor and tap element is disclosed. In one embodiment, a control element according to embodiments of the present invention includes a power transistor having first, second, third and fourth terminals. A control circuit is included, which is coupled to the third and fourth terminals of the power transistor. The power transistor adapted to switch a current between the first and second terminals in response a control signal to be received from the control circuit at the third terminal. A voltage between the fourth and second terminals of the power transistor is substantially proportional to a current flowing between the first and second terminals when a voltage between the first and second terminals is less than a pinch off voltage. The voltage between the fourth and terminals of the power transistor is substantially constant and less than the voltage between the first and second terminals when the voltage between the first and second terminals is greater than or equal to the pinch off voltage.

A high voltage transistor according to embodiments of the present invention includes a drain region having a first conductivity type. The transistor also includes at least one source region having the first conductivity type. At least one body region having a second conductivity type opposite to the first conductivity type is included in the transistor. The at least one body region adjoins the source region. The transistor includes at least one drift region having the first conductivity type and adjoining at a first end the drain region. The at least one drift region extends from the first end to adjoin at a second end the at least one body region. The at least one source region is separated from the second end of the at least one drift region by the at least one body region. The transistor further includes a tap region of a first conductivity type and a tap drift region extending from the tap region to the drain region. The transistor also includes an insulated gate adjacent to the at least one body region.

Additional features and benefits of the present invention will become apparent from the detailed description, figures and claims set forth below.

BRIEF DESCRIPTION OF THE DRAWINGS

The present invention detailed illustrated by way of example and not limitation in the accompanying figures.

FIG. 7 is a diagram illustrating a cross-sectional side view of another embodiment of a power transistor in accordance with the teachings of the present invention.

DETAILED DESCRIPTION

A novel control element including a power transistor with a tap element is disclosed. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

The following description uses the example of a power supply to illustrate the benefits of the present invention. It will be apparent to one skilled in the art that the techniques are not limited to use in power supplies but apply to any electronic circuit employing a control element with integrated power transistor.

In general, a power supply according to embodiments of the present invention includes a power control element that includes a control circuit and a power transistor. The control circuit and power transistor may be packaged together in a single package. A power transistor according to embodiments of the present invention includes a tap element that provides a voltage proportional to the current flowing through the power transistor when the voltage across the main terminals of the power transistor is less than a pinch off voltage. In one embodiment, when the voltage across the main terminals of the power transistor is greater than or equal to the pinch off voltage, the voltage provided at the tap element is substantially fixed at a voltage, which may be substantially less than the voltage across the main terminals of the power transistor.

In one embodiment, the tap element may be used for a start-up function for the power supply control element. In this embodiment, current is drawn from a main terminal of the power transistor through the tap element and into the control circuit.

In another embodiment, the tap element may be used to provide a signal for a current limit function of the power supply control element. In this embodiment, the tap element provides a voltage to the control circuit that is proportional to the current flowing through the power transistor.

In other embodiment, the tap element may be used provide other functions, such as for example sensing the voltage across the main terminals of the power transistor when the power transistor is in the off state. In addition, several or all of these functions may be realized in the same power supply control element.

Figure 1:
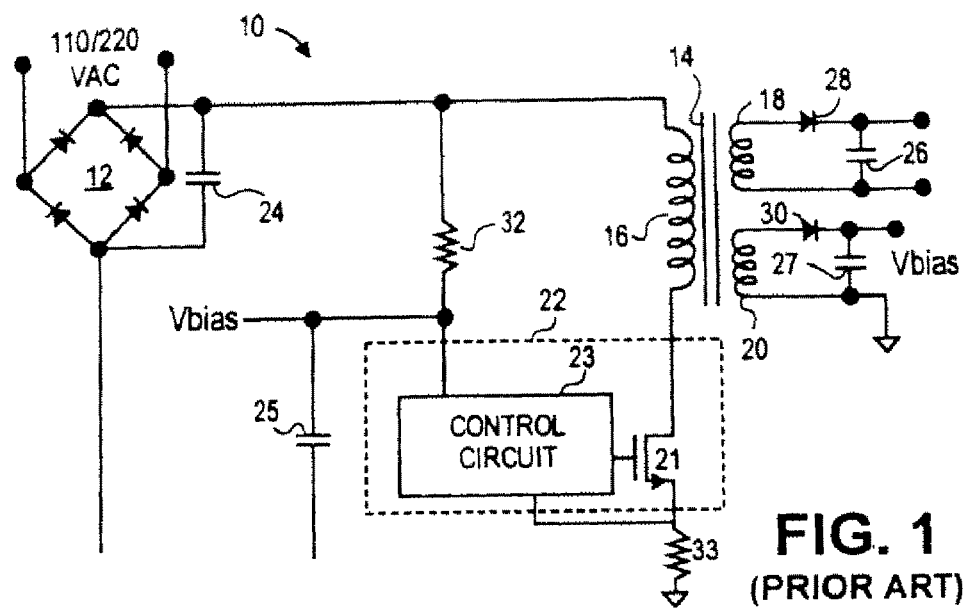
FIG. 1 is a schematic diagram of a known power supply that includes a separate control circuit and power transistor. A high voltage resistor is used to perform the start-up function and a sense resistor is used to provide the current limit function.
Figure 2:
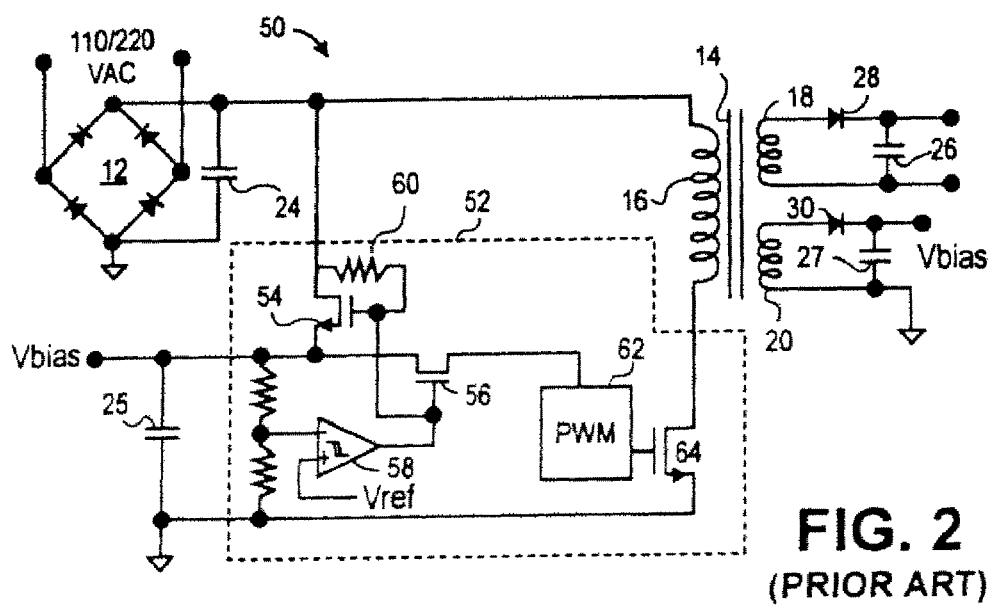
FIG. 2 is a schematic diagram of a known power supply that includes an integrated control circuit and power transistor. A separate offline transistor is used to perform the start-up function.
Figure 3:
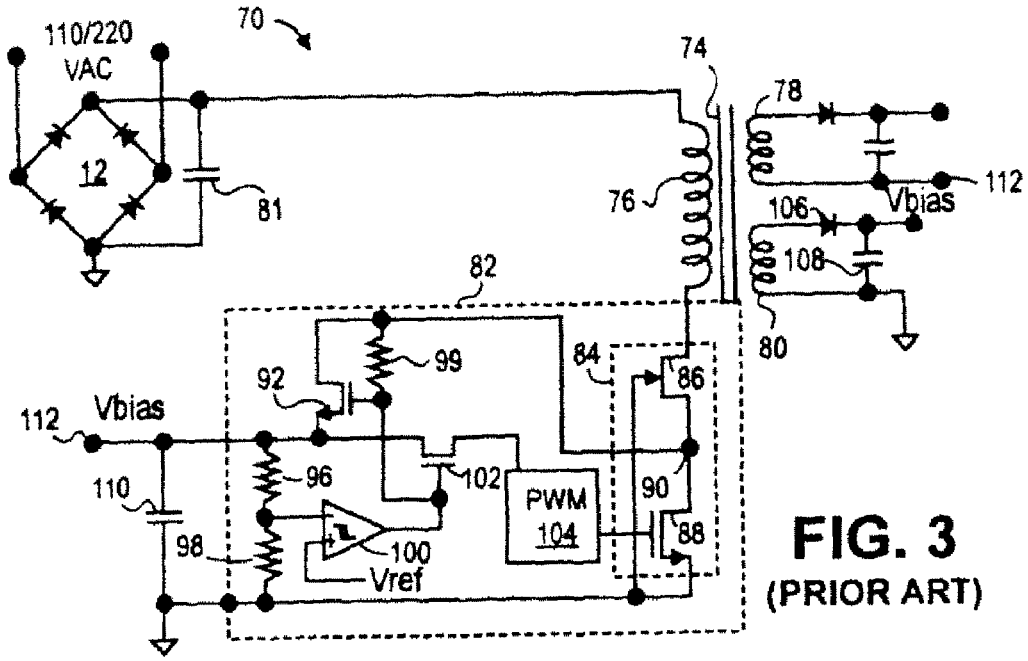
FIG. 3 is a schematic diagram of a known power supply that includes an integrated control circuit and power transistor. A tap in the integrated power transistor provides the start-up and current limit functions.
Figure 4:
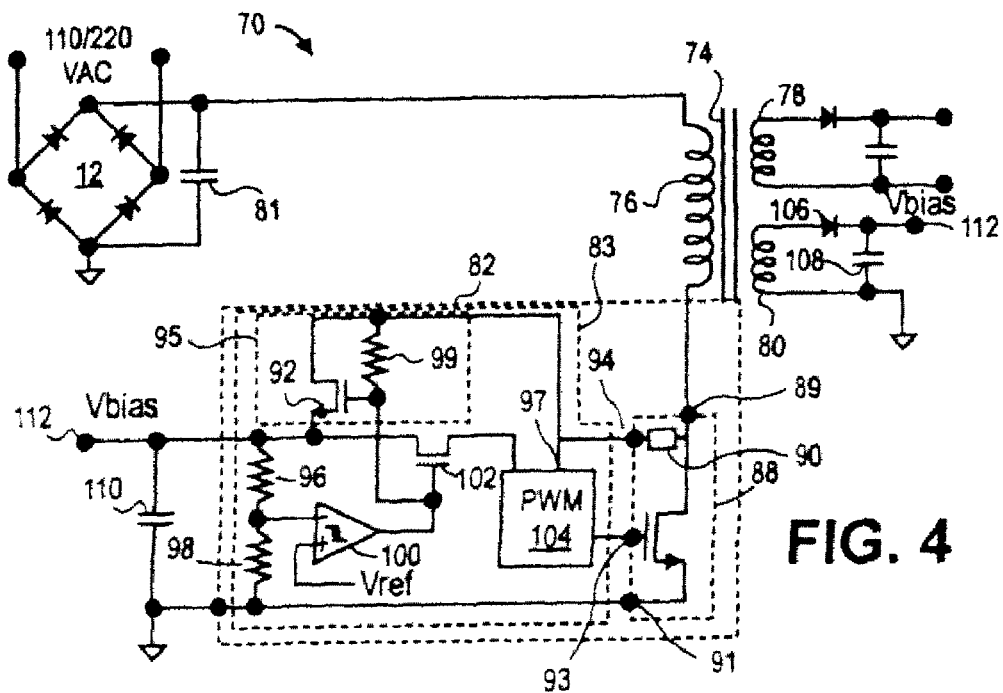
FIG. 4 is a schematic diagram of one embodiment of a power supply control element with a tap element in accordance with the teachings of the present invention.

To illustrate, FIG. 4 shows generally a schematic diagram of a power supply control element 82 in a power supply 70 according to embodiments of the present invention. In operation, alternating current (AC) voltage is rectified and filtered with rectifier 72 and capacitor 81. Energy transfer element 74 is coupled to receive the rectified voltage from rectifier 72 with primary winding 76. Energy transfer element also includes output winding 78 and bias winding 80. Energy is transferred across energy transfer element 74 from primary winding 76 to output winding 78 and bias winding 80 in response to power supply control element 82.

In one embodiment, power supply control element 82 includes control circuit 83 and power transistor 88 having main terminals 89 and 91, a tap element 90, a tap terminal 94 and a control terminal 93. In one embodiment, the main terminals 89 and 91 are the drain and source terminals, respectively, and control terminal 93 is the gate terminal of a power transistor 88 in accordance with the teachings of the present invention. In one embodiment, power transistor 88 is a metal oxide field effect transistor (MOSFET).

As shown in the depicted embodiment, main terminal 89 is coupled to primary winding 76 of energy transfer element 74. In operation, power transistor 88 is switched on and off to regulate the transfer of power from primary winding 76 to output winding 78 and bias winding 80. For example, in one embodiment, a feedback signal is received from the bias winding 80 through Vbias 112. Pulse width modulator (PWM) 104 is coupled to control terminal 93 to provide a control signal to switch power transistor 88 on and off in response to Vbias 112. It is appreciated of course that other configurations of switched mode power supplies may be employed that utilize power transistor 88 in accordance with the teachings of the present invention.

In one embodiment, power transistor 88 has a blocking voltage rating compatible with the peak voltage generated in the power supply circuit. When power transistor 88 is off, a relatively high voltage, which is greater than or equal to a pinch off voltage $V_P$ of power transistor 88, may be present across its main terminals 89 and 91. Under this condition, the maximum voltage appearing at tap terminal 94 is in one embodiment significantly reduced from the maximum voltage appearing at main terminal 89 of power transistor 88, such that the circuit elements in control circuit 83 are not subjected to excessive voltages in accordance with the teachings of the present invention.

In one embodiment, start-up circuitry 95 of control circuit 83 may employ the use of tap element 90 for a start-up function. For example, in the embodiment illustrated in FIG. 4, tap terminal 94 provides a voltage to a regulator 92 and a resistor 99 included in control circuit 83. To start up the power supply, current is drawn through the primary winding 76, power transistor 88 via tap element 90, and regulator 92 to charge up bypass capacitor 110. When the voltage at node 112 reaches the desired level, regulator 92 may be turned off.

In one embodiment, a line-sense function of control circuit 83 may also employ the use of tap element 90. For example, in the embodiment illustrated in FIG. 4, when the voltage at main terminal 89 decreases below a pinch off voltage, the tap terminal 94 provides a voltage to line sensor 97 that is substantially proportional to the voltage difference between main terminals 89 and 91 of the power transistor 88. The voltage provided by tap element 90 to line sensor 97 is coupled to the PWM circuit 104, such that PWM circuit 104 can provide a line sense function of control circuit 83. For example, the PWM circuit 104 may stop switching the power transistor 88 when the line voltage falls below a certain level.

In one embodiment, when power transistor 88 is turned on, a relatively low voltage appears across its main terminals 89 and 91 and current flows through the primary winding 76 and the main terminals 89 and 91 of power transistor 88. In this mode of operation, the voltage across main terminals 89 and 91 is below a pinch off voltage and tap element 90 therefore provides a voltage at tap terminal 94 that is substantially proportional to the current flowing through the main terminals of power transistor 88 in accordance with the teachings of the present invention. The tap terminal 94 voltage is coupled to the PWM circuit 104, such that PWM circuit 104 can provide a current limit function of the control element. In order to minimize the tolerance of the current limit function, it is preferable to package control circuit 82 and power transistor 88 together and then perform an electrical trimming operation to adjust the current limit of the complete control element 82.

Figure 5:
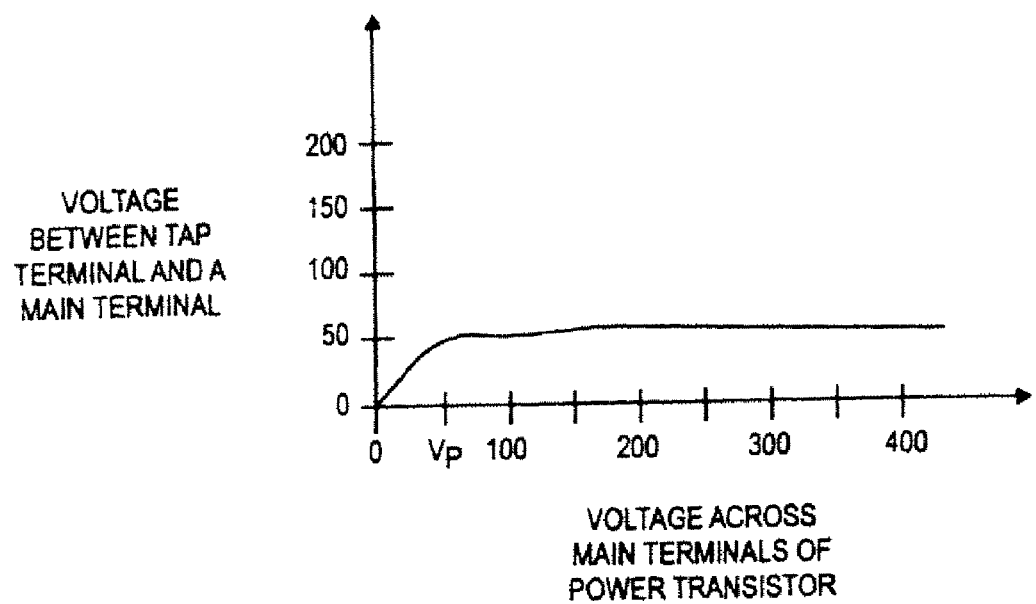
FIG. 5 is a diagram illustrating the relationship between the voltage across the drain and source terminals and a tap element of one embodiment of a power transistor in accordance with the teachings of the present invention.

FIG. 5 is a diagram illustrating the relationship between the voltage across the main terminals and the voltage of a tap terminal of one embodiment of a power transistor in accordance with the teachings of the present invention. The tap terminal voltage increases with increasing voltage across the main terminals of the power transistor up to a certain level and then remains relatively constant as the voltage across the power transistor is increased further. To illustrate, FIG. 5 shows the voltage at the tap terminal increasing with the voltage across the main terminals (e.g. between the drain and source terminals of the power MOSFET) until a pinch off voltage $V_P$, which in the illustrated embodiment is approximately 50V. Thus, the maximum voltage of the tap terminal is shown as about 50V in this example, but the maximum voltage could range from 5 to 150V in other embodiments. FIG. 5 also illustrates that the maximum voltage of the tap terminal in one embodiment remains substantially constant or fixed for voltage levels across the main terminals of the power transistor greater than or equal to the pinch off voltage V. In another embodiment, it is noted that the voltage at the tap terminal may increase with increasing voltage levels across the main terminals of the power transistor as long as the voltage at the tap element is reduced or limited so as not to subject the circuit elements in control circuit to excessive voltages in accordance with the teachings of the present invention.

Figure 6:
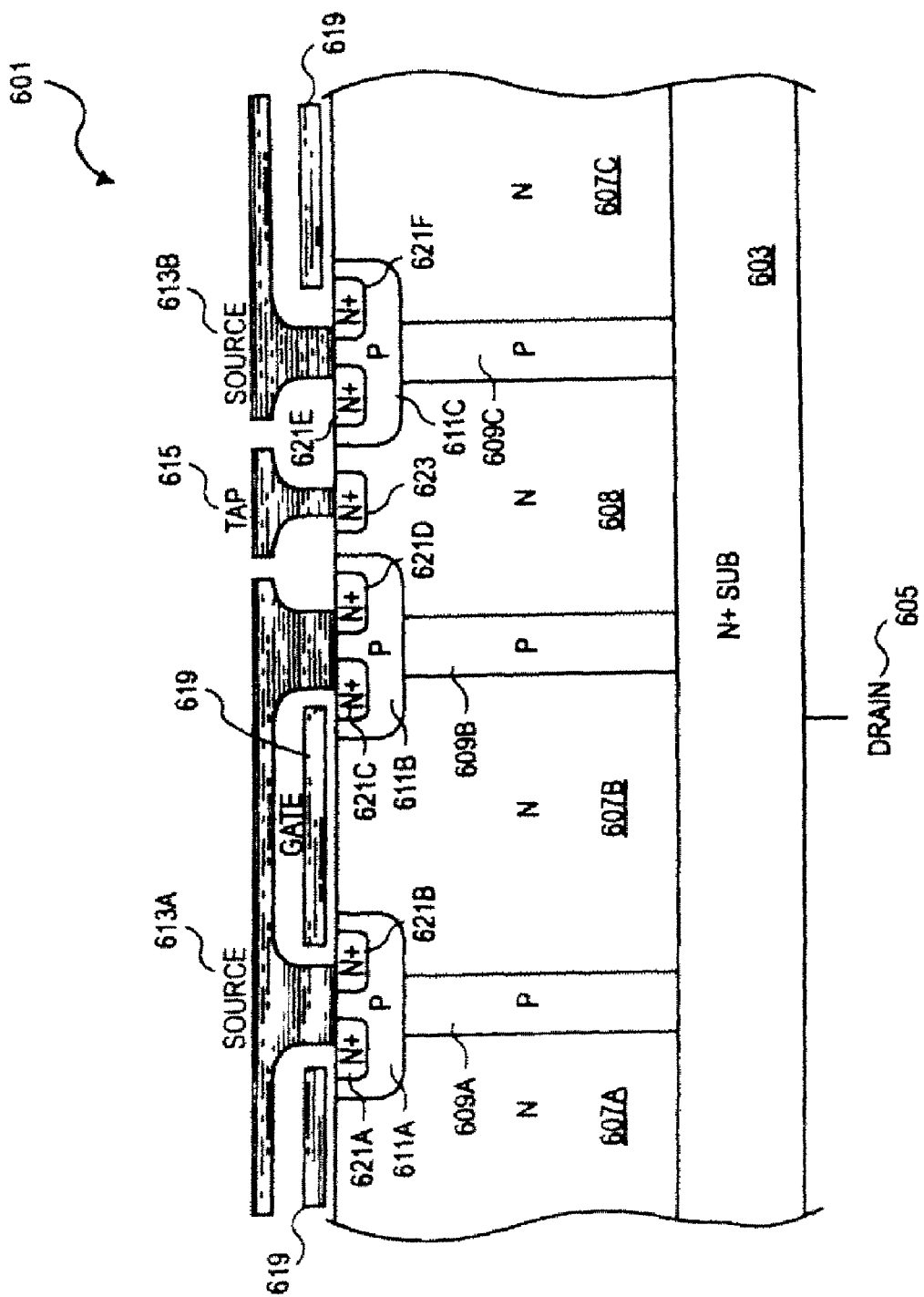
FIG. 6 is a diagram illustrating a cross-sectional side view of one embodiment of a power transistor in accordance with the teachings of the present invention.

FIG. 6 is a diagram illustrating a cross-sectional side view of one embodiment of a power transistor 601 in accordance with the teachings of the present invention. It is appreciated that although power transistor 601 has been illustrated as an n-channel transistor in FIG. 6, a p-channel transistor may be realized by utilizing the opposite conductivity types for all of the illustrated doped regions.

In one embodiment, power transistor 601 includes an insulated gate 619, including for example polysilicon, drain terminal 605 and source terminals 613, which are illustrated as 613A and 613B. N+ source regions 621, which are shown as 621A-F, are coupled to source terminals 613 and N+ drain region 603 is coupled to drain terminal 605. N+ source regions 621 are adjoining P− body regions 611, which are shown as 611A-C. A plurality of N− drift regions 607, which are shown as 607A-C, adjoin at one end N+ drain region 603 and extend from the N+ drain region 603 to adjoin at the other end P− body regions 611. In one embodiment, an N− tap drift region 608 is also included, which also extends from N+ drain region 603. An N+ tap region 623 adjoins N− tap drift region 608 at the opposite end from N+ drain region 603. A tap element 615 is coupled to N+ tap region 623. In one embodiment, N− tap drift region 608 is substantially similar to the N− drift regions 607 and may even be characterized as one of the plurality of N− drift regions 607. In another embodiment, N− tap drift region 608 may have a different construction, dimensions, such as for example width, and/or a different doping profile than the N− drift regions 607 to optimize or change the pinch off voltage $V_P$.

In one embodiment, N− drift regions 607 are separated by P− type regions 609 of semiconductor material. As illustrated in FIG. 6, the N− drift regions 607 are separated by P− type regions 609 of semiconductor material and are arranged such that alternating regions of N− drift regions 607 and P− type regions 609 of semiconductor material are interposed among one another in power transistor 601.

In the on state, insulated gate 619 is biased such that channels are formed proximate to insulated gate 619 across P− body regions 611 to form conduction paths between N+ source regions 621 and N− drift regions 607. Accordingly, conduction paths are provided through N− drift regions 607 between source electrodes 613 and drain electrode 605. In the off state, insulated gate 619 is biased such that there are no longer channels under insulated gate 619 through P− body regions 611 to form conduction paths between source electrodes 613 and drain electrode 605.

In operation, when N+ drain region 603 is biased at a relatively low voltage with respect to N+ source regions 621, tap element 615 is resistively coupled to drain terminal 605 through N+ tap region 623 and through N− tap drift region 608. Accordingly, tap element 615 in one embodiment tracks the voltage of drain terminal 605 and is therefore proportional to the current through drain terminal 605. In one embodiment, these conditions occur with the voltage difference between the main terminals, source and drain terminals 613 and 605, is less than the pinch off voltage $V_P$. However, at a higher drain terminal 605 bias, or when the voltage difference between the main terminals, source and drain terminals 613 and 605, is greater than or equal to the pinch off voltage $V_P$, a portion of the tap N− type regions 608 is substantially or completely depleted of free charge carriers by P− type regions 609 on the neighboring sides of N− tap drift region 608.

In the embodiment illustrated FIG. 6, the P− type regions 609 are illustrated as pillars and are numbered as 609A-C on either sides of N− drift regions 607 as well as N− tap drift region 608. In one embodiment, when the N− drift regions 607 and N− tap drift region 608 are completely depleted of free charge carriers, the voltage of tap element 615 is effectively fixed at Vp when the voltage difference between the main terminals, source and drain terminals 613 and 605, is greater than or equal to $V_P$, as illustrated for example in FIG. 5.

FIG. 7 is a diagram illustrating a cross-sectional side view of another embodiment of a power transistor 701 in accordance with the teachings of the present invention. It is appreciated that although power transistor 701 has been illustrated as an n-channel transistor in FIG. 7, a p-channel transistor may be realized by utilizing the opposite conductivity types for all of the illustrated doped regions.

In one embodiment, power transistor 701 includes insulated gates 719, shown as insulated gates 719A-F, drain terminal 705 and source terminals 713, which are illustrated as 713A and 713B. N+ source regions 721, which are shown as 721A-D, are coupled to source terminals 713 and N+ drain region 703 is coupled to drain terminal 705. N+ source regions 721 are adjoining P− body regions 711, which are shown as 711A and 711B. A plurality of N− drift regions 707, which are shown as 707A and 707B, adjoin at one end N+ drain region 703 and extend from the N+ drain region 703 to adjoin at the other end P− body regions 711. In one embodiment, an N− tap drift region 708 is also included, which also extends from the N+ drain region 703. An N+ tap region 723 adjoins N− tap drift region 708 at the opposite end from N+ drain region 703. A tap element 715 is coupled to N+ tap region 723. In one embodiment, N− tap drift region 708 is substantially similar to the N− drift regions 707 and may even be characterized as one of the plurality of N− drift regions 707. In another embodiment, N− tap drift region 708 may have a different construction, dimensions, such as for example width, and/or a different doping profile than the N− drift regions 707 to optimize or change the pinch off voltage $V_P$.

In one embodiment, N− drift regions 707 and N− tap drift region 708 are separated by regions of dielectric material 709 in which field plates 725 are disposed. As illustrated in the embodiment of FIG. 7, dielectric material regions 709 are shown as 709A-D and in one embodiment may include oxide. Field plates 725 are shown as 725A and 725B and are coupled to source terminals 713. In the depicted embodiment, the N− drift regions 707 are separated by regions of dielectric material 709 and field plates 725 such that alternating regions of N− drift regions 707 and regions of dielectric material 709 and field plates 725 are interposed among one another in power transistor 701.

In the on state, insulated gates 719 are biased such that channels are formed proximate to insulated gates 719 across P− body regions 711 to form conduction paths between N+ source regions 721 and N− drift regions 707. Accordingly, conduction paths are provided through N− drift regions 707 between source electrodes 713 and drain electrode 705. In the off state, insulated gates 719 are biased such that there are no longer channels proximate to insulated gates 719 through P− body regions 711 to form conduction paths between source electrodes 713 and drain electrode 705.

In operation, when N+ drain region 703 is biased at a relatively low voltage with respect to N+ source regions 721, tap element 715 is resistively coupled to drain terminal 705 through N+ tap region 723 and through N− tap drift regions 708. Accordingly, the voltage of tap element 715 tracks the voltage of drain terminal 705 and is therefore proportional to the current through drain terminal 705. In one embodiment, these conditions occur with the voltage difference between the main terminals, source and drain terminals 713 and 705, is less than the pinch off voltage $V_P$. However, at a higher drain terminal 705 bias, or when the voltage difference between the main terminals, source and drain terminals 713 and 705, is greater than or equal to the pinch off voltage $V_P$, a portion of the N− drift regions 707 and N− tap drift region 708 is substantially or completely depleted of free charge carriers by field plates 725 disposed in the dielectric regions 709 on neighboring sides of N− drift regions 707 and N− tap drift region 708.

The voltage of tap element 715 is effectively fixed at Vp when the voltage difference between the main terminals, source and drain terminals 713 and 705, is greater than or equal to $V_P$, as illustrated for example in FIG. 5.

In the foregoing detailed description, the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A high voltage transistor, comprising:
   a drain region of a first conductivity type;
   a source region of the first conductivity type;
   a tap region of the first conductivity type;
   a body region of a second conductivity type, the body region adjoining the source region;
   a drift region of the first conductivity type extending from the drain region to the body region;
   a tap drift region of the first conductivity type extending from the drain region to the tap region, wherein the tap region adjoins the tap drift region at an end of the tap drift region opposite the drain region; and
   means for substantially fixing a voltage between the tap region and the source region to be substantially constant and less than a voltage between the drain region and the source region in response to the voltage between the drain region and the source region exceeding a pinch off voltage.

2. The high voltage transistor of claim 1, further comprising means for depleting the tap drift region of free charge carriers in response to the voltage between the drain region and the source region exceeding a pinch off voltage.

3. The high voltage transistor of claim 1, further comprising means for allowing the voltage at the tap region to track the voltage between the drain region and the source region in response to the voltage between the drain region and the source region being less than the pinch off voltage.

4. The high voltage transistor of claim 1, further comprising a field plate disposed between the drift region and the tap drift region.

5. The high voltage transistor of claim 4, further comprising:
   a source electrode coupled to the source region and the field plate;
   a drain electrode coupled to the drain region; and
   an insulated gate disposed adjacent to the body region.

6. The high voltage transistor of claim 5, wherein the field plate is disposed in dielectric material comprising silicon dioxide.

7. The high voltage transistor of claim 1, wherein the voltage between the tap region and the source region is proportional to the voltage between the drain region and the source region in response to the voltage between the drain region and the source region being less than the pinch off voltage.

8. A high voltage transistor, comprising:
   a drain region of N type semiconductor material;
   a source region of N type semiconductor material;
   an N type tap region of N type semiconductor material;
   a body region of P type semiconductor material adjoining the source region;
   a drift region of N type semiconductor material extending from the drain region to the body region;
   a tap drift region of N type semiconductor material extending from the drain region to the tap region, wherein the tap region adjoins the tap drift region at an end of the tap drift region opposite the drain region; and
   P type regions disposed on neighboring sides of the tap drift region for substantially depleting the tap drift region of free charge carriers in response to a voltage between the drain region and the source region exceeding a pinch off voltage, such that a voltage between the tap region and the source region is substantially constant and less than the voltage between the drain region and the source region.

9. The high voltage transistor of claim 8, wherein the P type regions disposed on the neighboring sides of the tap drift region are configured to allow the voltage at the tap region to track the voltage between the drain region and the source region in response to the voltage between the drain region and the source region being less than the pinch off voltage.

10. The high voltage transistor of claim 8, further comprising a field plate disposed between the drift region and the tap drift region.

11. The high voltage transistor of claim 10, further comprising:
a source electrode coupled to the source region and the field plate;
a drain electrode coupled to the drain region; and
an insulated gate disposed adjacent to the body region.

12. The high voltage transistor of claim 11, wherein the field plate is disposed in dielectric material comprising silicon dioxide.

13. The high voltage transistor of claim 8, wherein the voltage between the tap region and the source region is proportional to the voltage between the drain region and the source region in response to the voltage between the drain region and the source region being less than the pinch off voltage.

* * * * *